(12) United States Patent
Zhao et al.

(10) Patent No.: US 12,248,004 B2
(45) Date of Patent: Mar. 11, 2025

(54) MEMBRANE PROBE CARD AND ITS PROBE HEAD

(71) Applicant: Maxone Semiconductor Co., Ltd, Jiangsu (CN)

(72) Inventors: Liangyu Zhao, Suzhou (CN); Haichao Yu, Suzhou (CN); Ailin Wang, Suzhou (CN)

(73) Assignee: MAXONE SEMICONDUCTOR CO., LTD., Suzhou (CN)

( * ) Notice: Subject to any disclaimer, the term of this patent is extended or adjusted under 35 U.S.C. 154(b) by 0 days.

(21) Appl. No.: 17/726,706

(22) Filed: Apr. 22, 2022

(65) Prior Publication Data
US 2023/0168279 A1   Jun. 1, 2023

(30) Foreign Application Priority Data
Nov. 29, 2021   (CN) .......................... 202111433598.X (51) Int. Cl.
*G01R 1/073* (2006.01)
(52) U.S. Cl.
CPC .................. *G01R 1/07342* (2013.01)
(58) Field of Classification Search
None
See application file for complete search history.

(56) References Cited

U.S. PATENT DOCUMENTS

| | | | |
|---|---|---|---|
| 5,395,253 A | 3/1995 | Crumly | |
| 5,825,192 A * | 10/1998 | Hagihara | G01R 31/2887 324/762.01 |
| 6,060,891 A * | 5/2000 | Hembree | G01R 1/073 324/755.04 |
| 7,893,704 B2 | 2/2011 | Gleason et al. | |
| 2005/0184743 A1* | 8/2005 | Kimura | G01R 1/07342 324/754.03 |
| 2015/0192609 A1* | 7/2015 | Hsu | G01R 31/2601 324/754.03 |
| 2019/0361051 A1* | 11/2019 | Vettori | G01R 1/07371 |

* cited by examiner

*Primary Examiner* — Nasima Monsur
(74) *Attorney, Agent, or Firm* — Oliff PLC (57) ABSTRACT

A membrane probe card and its probe head, and the membrane probe card comprises a membrane probe head, and the membrane probe head consists of a support, membrane, a probe and an interconnecting wire; a concave supporting structure is arranged between the acting surface of the support and the membrane; the concave supporting structure comprises a concave structure and a supporting elastic layer, and the concave structure comprises one or more concaves, the concave corresponds to the position of the probe and the concaves are eccentric with the corresponding probes; the convex insert of the supporting elastic layer is embedded in the corresponding concave to generate a thickness difference between the two sides of each probe on the supporting elastic layer.

16 Claims, 4 Drawing Sheets

MEMBRANE PROBE CARD AND ITS PROBE HEAD

TECHNICAL FIELD

The invention belongs to the technical field of probe card and wafer test, in particular relates to a membrane probe card and its probe head.

BACKGROUND OF INVENTION

In recent years, with the development and popularization of 5G technology and consumer electronics technology, semiconductor devices continue to develop towards miniaturization, integration and densification of pad pitch, and the working frequency continues to be improved, and the wafer level test for high frequency has gradually become an important part of RF chips production. Compared with other types of probe cards, the membrane probe card realizes small-scale probe structure processing and high-precision signal line structure parameter control, reduces the generation of parasitic capacitance and inductance, greatly shortens the signal path and improves the impedance matching degree, so it is widely used in wafer level test and analysis for high frequency.

During wafer test, it is necessary to provide appropriate measuring slippage and controllable contact force.

Measuring slip refers to the slight horizontal movement of the probe when the probe starts to contact with the tested pad and starts the vertical lifting movement. It is extremely necessary to push away the oxide on the surface of the tested pad or bump to obtain stable electrical contact: if the slip is too small, the vertical contact force required for the probe to obtain stable contact may be too large, causing damage to the Pad; if the slip is too big, the probe may contact the outer passivation layer of Pad, causing damage to the tested object.

The controllable contact force plays a positive role in ensuring that the chip pad is not damaged. At present, the commonly used pad and bump materials include aluminum, gold, copper or solder: aluminum surface is prone to oxidize in the air, and the force of 3-5 gf is generally required in the test to penetrate or push away the surface oxide and achieve stable contact; the contact force required for gold material is very small due to its softness, generally between 0.1-1 gf; and the bigger force is required for copper material to achieve good contact, about 5-6 gf. With the miniaturization and integration of semiconductor technology, the thinner dielectric layer between the metal layer of the welding pad and the low-k layer also has improved the control requirements for the contact force of the probe.

The U.S. Pat. No. 5,395,253 proposes: The initial membrane is in the tensile state, and when the probe comes into contact with the tested Pad and starts the vertical lifting movement, the membrane gradually comes to the relaxed state, and the probe will make a slight horizontal movement toward the central area of the membrane, resulting in the measuring slip. A significant disadvantage of this method is that the measuring slippage of the probe is related to the position of the probe relative to the center of the membrane, and it is not even.

In the prior art, the most representative structure is shown in U.S. Pat. No. 7,893,704, and it proposes a new type of membrane probe structure, which designs the probe as a cantilever-like structure, and realizes the measuring slip by using the rotation of the cantilever-like probe structure around the end of the cantilever in the test. However, in this way, the stress is concentrated and the membrane is easily damaged as the probe has to rotate around the end of the cantilever repeatedly.

It's obvious that there is an urgent need in the art for a membrane probe card, which can achieve appropriate measuring slip and provide controllable contact force, particularly, can reduce the stress of the membrane probe and improve the service life of the membrane probe.

DISCLOSURE OF THE INVENTION

The invention aims to provide a membrane probe card and its probe head, which can achieve appropriate measuring slip of probe and provide controllable contact force during the test, particularly, can reduce the stress of the membrane probe during the use and improve its service life.

In order to achieve the above-mentioned purpose, the technical solution for the membrane probe card adopted in the present invention is: A membrane probe card consists of a PCB board, a connector and a membrane probe head; the membrane probe head consists of a support providing an acting surface, membrane covering the acting surface of the support, a probe and an interconnecting wire arranged on the membrane. A concave supporting structure is arranged between the acting surface of the support and the membrane; the concave supporting structure comprises a concave structure and a supporting elastic layer, and the concave structure comprises one or more concaves fixed relative to the acting surface, the concave corresponds to the position of the probe and each concave is eccentric to the projection of its corresponding probe on the acting surface; the supporting elastic layer is embedded between the concave structure and the membrane, and the supporting elastic layer is provided with convex insert relative to the concave in the concave structure, and the convex insert of the supporting elastic layer is embedded in the corresponding concave; so, the two parts of the supporting elastic layer which are divided by the probe have a thickness difference.

In above described technical solution, the concave is column-shaped or frustum-shaped groove in the vertical section, and the projection of the probe in the up-down direction is across the outer contour line of the corresponding groove.

In above described technical solution, the concave is hemisphere-shaped or spherical crown-shaped groove in the vertical section, and the projection of the probe in the up-down direction is within the outer contour line of the corresponding groove, but the center of the probe is staggered with the center of the groove.

In above described technical solution, the concave supporting structure also comprises a supporting rigid body, the supporting rigid body is fixedly covered on the acting surface of the support, and the concave structure is arranged on the lower surface of the supporting rigid body.

In above described technical solution, the support has a convex protruding downward in the middle and the lower surface of the convex is used as the acting surface; a connecting surface is arranged on the periphery of the convex of the support to contact against the PCB board, and the connecting surface is also covered by the membrane, and a probe is also arranged at the membrane corresponding to the connecting surface, and the concave supporting structure is also arranged between the connecting surface of the support and the membrane, and the supporting elastic layer in the concave supporting structure is embedded between the connecting surface and the membrane.

In above described technical solution, "the concave corresponds to the position of the probe and the concaves are eccentric with the projections of the corresponding probes on the acting surface" refers to: the concave needs to correspond to the probe, and one concave can correspond to one probe, or one concave can correspond to several probes; and the corresponding positional relationship between them should be eccentric, that is, the centers should be staggered, so as to there is a thickness difference between two sides of each probe on the supporting elastic layer. The specific position relationship between the concave and the probe is also related to the shape of the concave, for example: the concave is basically in the shape of uniform section (such as a column-shaped or truncated-shaped groove), the projection of the probe in the up-down direction needs to be across the outer contour line of the corresponding concave, so as to generate the thickness difference of the elastic layer lined at the two sides of the probe; when the concave is in the shape of variable cross-section (such as hemispherical body, spherical crown body and semi-elliptical spherical body), it can generate the thickness difference of the elastic layer lined at the two sides of the probe as long as the projection of the probe in the up-down direction is eccentrically located within the outer contour line of the corresponding concave and is staggered with the center of the concave.

In order to achieve the above-mentioned purpose, the technical solution for the membrane probe head adopted in the present invention is: A membrane probe head consists of a support providing an acting surface, membrane covering the acting surface of the support, a probe and an interconnecting wire arranged on the membrane; a concave supporting structure is arranged between the acting surface of the support and the membrane; the concave supporting structure comprises a concave structure and a supporting elastic layer, and the concave structure comprises one or more concaves fixed relative to the acting surface, the concave corresponds to the position of the probe and the concaves are eccentric with the projections of the corresponding probes on the acting surface; the supporting elastic layer is embedded between the concave structure and the membrane, and the supporting elastic layer is provided with convex insert relative to the concave structure, and the convex insert of the supporting elastic layer is embedded in the corresponding concave; so, the two parts of the supporting elastic layer which are divided by the probe have a thickness difference.

In above described technical solution, the concave is column-shaped or frustum-shaped groove in the vertical section, and the projection of the probe in the up-down direction is across the outer contour line of the corresponding groove.

In above described technical solution, the concave is hemisphere-shaped or spherical crown-shaped groove in the vertical section, and the projection of the probe in the up-down direction is within the outer contour line of the corresponding groove, but the center of the probe is staggered with the center of the groove.

In above described technical solution, the concave supporting structure also comprises a supporting rigid body, the supporting rigid body is fixedly covered on the acting surface of the support, and the concave structure is arranged on the lower surface of the supporting rigid body.

In above described technical solution, the support has a convex protruding downward in the middle and the lower surface of the convex is used as the acting surface; a connecting surface is arranged on the periphery of the convex of the support to contact against the PCB board, and the connecting surface is also covered by the membrane, and a probe is also arranged at the membrane corresponding to the connecting surface, and the concave supporting structure is also arranged between the connecting surface of the support and the membrane, and the supporting elastic layer in the concave supporting structure is embedded between the connecting surface and the membrane.

In above described technical solution, "the concave corresponds to the position of the probe and the concaves are eccentric with the projections of the corresponding probes on the acting surface" refers to: the concave needs to correspond to the probe, and one concave can correspond to one probe, or one concave can correspond to several probes; and the corresponding positional relationship between them should be eccentric, that is, the centers should be staggered, so as to there is a thickness difference between two sides of each probe on the supporting elastic layer. The specific position relationship between the concave and the probe is also related to the shape of the concave, for example: the concave is basically in the shape of uniform section (such as a column-shaped or truncated-shaped groove), the projection of the probe in the up-down direction needs to be across the outer contour line of the corresponding concave, so as to generate the thickness difference of the elastic layer lined at the two sides of the probe; when the concave is in the shape of variable cross-section (such as hemispherical body, spherical crown body and semi-elliptical spherical body), it can generate the thickness difference of the elastic layer lined at the two sides of the probe as long as the projection of the probe in the up-down direction is eccentrically located within the outer contour line of the corresponding concave and is staggered with the center of the concave.

The invention skillfully adds the concave supporting structure to generate the thickness difference of the elastic layer lined at the two sides of the probe, so that the probe can generate the appropriate measuring slip during the contact process to penetrate or push away the surface oxide of the tested chip and achieve more stable contact. Moreover, since the concave supporting structure is set between the acting surface of the support and the membrane for transformation, and the probe is not changed, the probe can be of an ordinary symmetrical structure. During the test: In the initial state, the probe doesn't contact the tested chip Pad, the elastic component covered above the support is in the initial compression state, and the elastic layer of the concave supporting structure is also in the uncompressed state; with the application of test OD, the probe contacts the tested chip Pad and displaces in the vertical direction, and most of the displacement is absorbed by the elastic component, and the rest is absorbed by the probe and the concave supporting structure together; at this time, due to the different thickness of the supporting layer covered on two sides of the probe, the probe inclines slightly while moving vertically, and the probe slips in the horizontal direction, which can push away the dirt and oxide on the surface of the tested chip and achieve a more stable electrical connection.

The beneficial effects of the invention are:
1. The invention adds the concave supporting structure to generate the thickness difference of the elastic layer lined at the two sides of the probe, so that it achieves the vertical movement of the probe and the side-slip in the horizontal direction to realize the stable and reliable electrical contact.
2. The invention can finally control the thickness difference of the supporting elastic layer on two sides of the probe by controlling the eccentricity between the concave and the corresponding probe, as well as the depth of the concave, so as to achieve the control of measuring slippage, and then achieve the control of the contact force by controlling the thickness of the plane part of the supporting elastic layer.

3. The invention achieves the absorption and compatibility of solving the planarity problems such as local height difference and overall inclination of the probe by adding the supporting elastic layer and prevents the problems of damage of tested Pad or loose connection and open circuit of the probe caused by the excessive contact force due to too long or too short of the local probe.

In the above figures: 1. PCB board; 11. Coaxial connector; 12. Signal connection point; 13. PCB wire; 14. Spring structure; 15. PCB-end threaded hole;
  2. Connector;
  3. Membrane probe head;
  31. Support; 311. Acting surface; 312. Connecting surface;
  32. Membrane;
  33. Probe; 331. Probe base structure; 332. Probe tip structure;
  34. Interconnecting wire;
  35. Concave supporting structure; 351. Concave structure; 3511. Concave; 352. Supporting elastic layer; 3521. Convex insert; 353. Supporting rigid body;
  36. Adhesive layer;
  37. Elastic component;
  38. Stiffener; 381. Assembly screw holes; 382. Leveling screw holes;
  39. Leveling screw.

Specific Embodiment

With reference to the accompanying drawings and embodiment, the present invention will be described in detail.

Embodiment 1: Refer to FIG. 1-6

Figure 1:
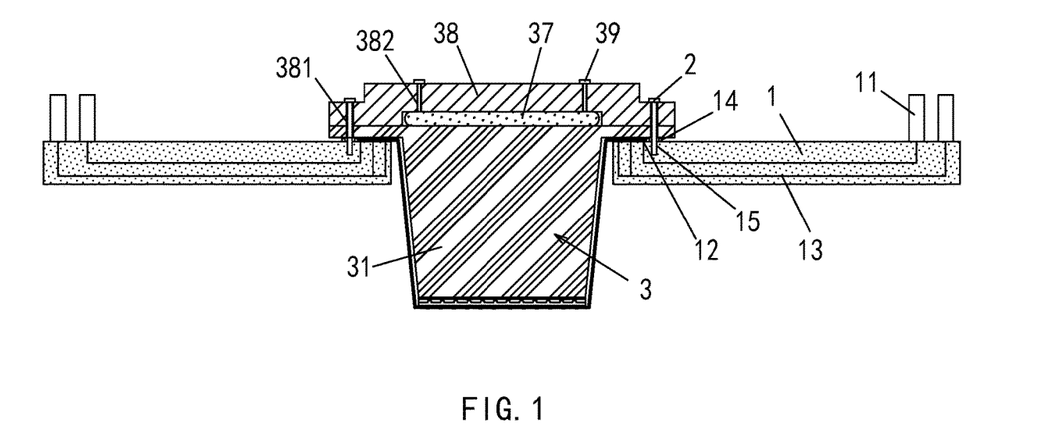
FIG. 1 is a schematic view of a membrane probe card according to embodiment 1 and embodiment 3 of the present invention.
Figure 2:
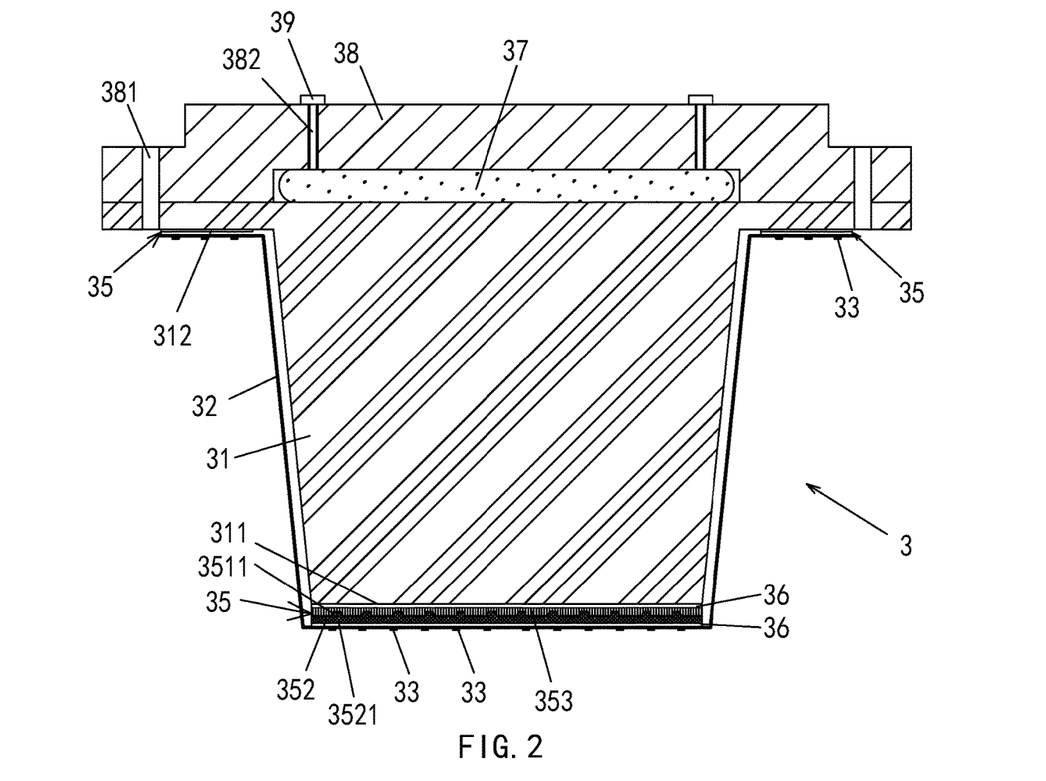
FIG. 2 is a schematic view of a membrane probe head according to embodiment 1, embodiment 2 and embodiment 3 of the present invention.

A membrane probe card consists of a PCB board 1, a connector 2 and a membrane probe head 3; the membrane probe head 3 consists of a support 31 providing an acting surface 311, membrane 32 covering the acting surface 311 of the support 31, a probe 33 and an interconnecting wire 34 arranged on the membrane 32.

PCB board 1 is a multi-layer epoxy resin circuit board, on which coaxial connector 11 and signal connection point 12 are distributed, and PCB wire 13 is distributed inside, which respectively connects coaxial connectors 11 to corresponding signal connection points 12 to realize electrical signal transduction and transmission; the PCB board 1 is also distributed with spring structure 14 and PCB-end threaded hole 15 on its surface; the center of PCB board 1 is hollowed out to accommodate the membrane probe head 3; the spring structure 14 is located at the outer circumference of the central hollow part of the PCB board 1 and is used to realize the close connection with the membrane probe head 3.

The support 31 is a rigid body, wherein it has a convex protruding downward in the middle and the lower surface of the convex is used as the acting surface 311. A connecting surface 312 is arranged on the periphery of the convex of the support 31 to contact against the PCB board 1, and the connecting surface 312 is also covered by the membrane 32, and a probe 33 is also arranged at the membrane 32 corresponding to the connecting surface 312, and the probe 33 is used for docking with the PCT board 1.

Figure 3:
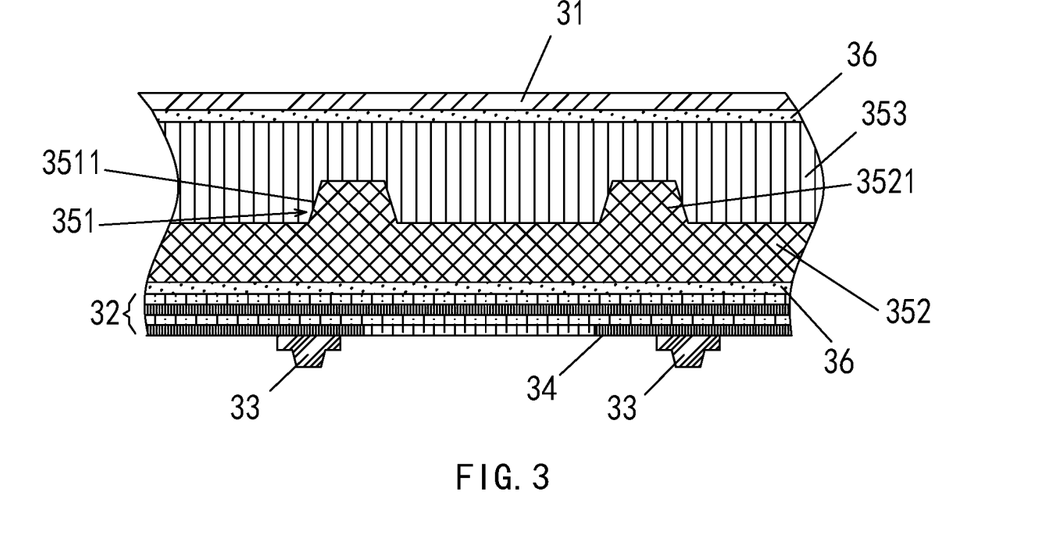
FIG. 3 is a view of the concave supporting structure of the membrane probe head according to embodiment 1 and embodiment 2 of the present invention.
Figure 5:
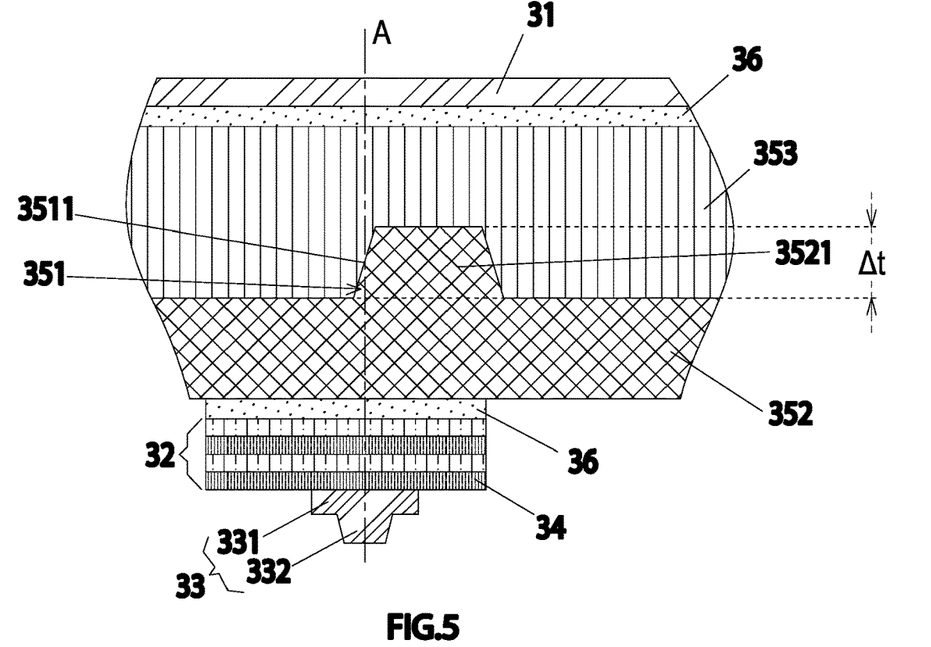
FIG. 5 is a view of the probe position before the test according to embodiment 1 and embodiment 2 of the present invention.

A concave supporting structure 35 is arranged between the acting surface 311 of the support 31 and the membrane 32; the concave supporting structure 35 comprises a concave structure 351 and a supporting elastic layer 352, and the concave structure 351 comprises several concaves 3511 fixedly distributed relative to the acting surface 311, the concaves 3511 are arranged towards the probe 33 and correspond to the probes respectively and the concaves 3511 are eccentric with the projections of the corresponding probes 33 on the acting surface 311; the supporting elastic layer 352 is embedded between the concave structure 351 and the membrane 32, and the supporting elastic layer 352 is provided with convex insert 3521 relative to each concave 3511 the concave structure 351, and the convex insert 3521 of the supporting elastic layer 352 is embedded in the corresponding concave; so in this way, the two parts of the supporting elastic layer 352 which are divided by the probe 33 have a thickness difference $\Delta t$ (FIG. 5). In particular, as shown in FIG. 5, there is a thickness difference $\Delta t$ between the thickness of the supporting elastic layer 352 (including the convex insert 3521) on one side of an axis A of the probe 33 in the extension direction of the supporting elastic layer 352 and the thickness of the supporting elastic layer 352 on the opposite side of the axis A of the probe 33 in the extension direction.

Specifically, the concave supporting structure 35 of the embodiment also comprises a supporting rigid body 353, and the supporting rigid body 353 is fixedly covered on the acting surface 311 of the support 31, and the concave structure 351 is arranged on the lower surface of the supporting rigid body 351. The supporting rigid body 353 can be made from high temperature resistant hard materials such as silicon, glass and PMMA, and the concave structure 351 can be processed by corrosion process.

Specifically, the upper surface of the supporting elastic layer 352 is conformal to the surface of supporting the rigid body 353 and completely fills in the concave structure 351, while the lower surface of the supporting elastic layer 352 is parallel to the acting surface 311. The supporting elastic layer 352 has a certain thickness relative to the surface of the supporting rigid body 353, and the thickness of the supporting elastic layer 352 on two sides of the wall edge of the concave 3511 is different. The supporting elastic layer 352 is made from flexible materials such as PDMS and silica gel, etc., and the elasticity can be adjusted by adjusting the material ratio and curing temperature, so as to realize the absorption and compatibility of slightly height difference between the tested chip Pad or probe structure.

Specifically, the membrane 32 can be fixedly covered on the supporting elastic layer 352 through the adhesive layer 36.

Figure 4:
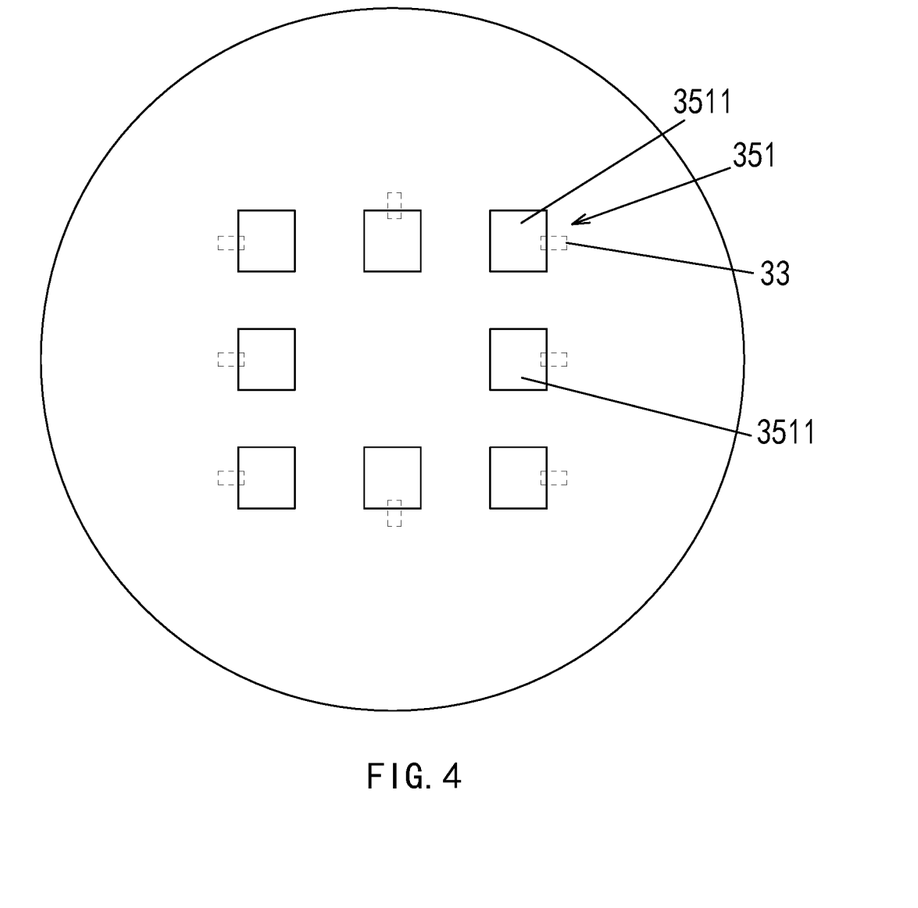
FIG. 4 is a view of the corresponding positions of each concave and the probe in the concave structure according to embodiment 1 and embodiment 2 of the present invention.

Specifically, the vertical section of the concave is column-shaped or truncated-shaped groove, and the figure shows the truncated-shaped one. And the projection of the probe 33 in the up-down direction is across the outer contour line of the corresponding concave.

In order to generate the measuring slip for the probe butted with the PCB board 1, the concave supporting structure 35 is also arranged between the connecting surface 312 of the support 31 and the membrane 32, and the supporting elastic layer 352 in the concave supporting structure 35 is embedded between the connecting surface 312 and the membrane 32. The specific structure of the concave supporting structure 35 is the same as the concave supporting structure 35 between the acting surface 311 of the support 31 and the membrane 32, which will not be repeated here.

The probe 33 specifically consists of a probe base structure 331 and a probe tip structure 332. The probe tip structure 332 is located on the probe base structure 331. The probe base structure 331 can be rectangular, cylindrical, prismatic, etc., and can be made from rhodium, Ni or PD-Ni, Ni—B alloy and other high-hardened materials. The probe tip structure can be the shape of truncated pyramid or trustum, cone, etc., and can be made from wear-resistant materials such as rhodium, Ni or PD-Ni, Ni—B alloy.

A stiffener 38 is also arranged above the support 31, and the stiffener 38 is a metal plate with a concave area in the center, and it's equipped with assembly screw holes 381 and leveling screw holes 382. Its edge is connected with the support 31 and the central concave area is used to accommodate elastic component 37 and the elastic component 37 can be an elastomer structure such as an air bag and a multi-pawl spring. As shown in the figure, the elastic component 37 is an air bag. The leveling screw 39 is located in the leveling screw hole 382, and the bottom is in contact with the upper surface of the elastic component 37. Adjusting the relative position of several leveling screws 39 can realize the correction of the inclination between the stiffener 38 and the support 31.

The elastic component 37 is located between the stiffener 38 and the support 31. During the test, the elastic component 37 is in a compressed state. When OD is applied, the elastic component 37 can undergo elastic deformation and absorb the displacement in the vertical direction.

Figure 6:
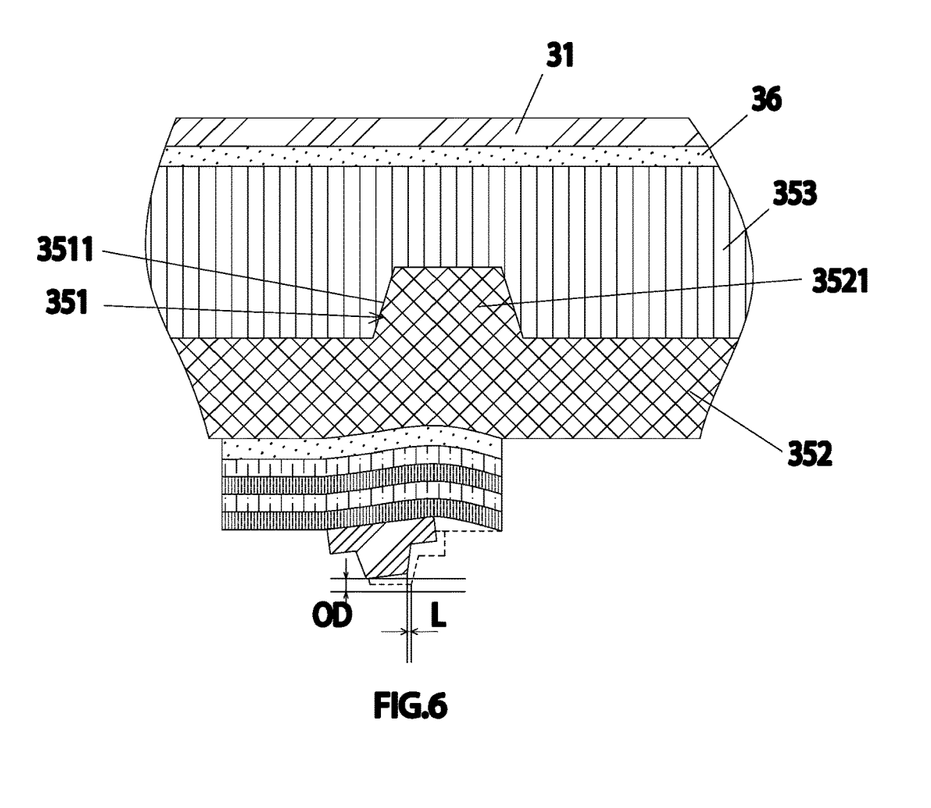
FIG. 6 is a view of the comparison of probe position during the test according to embodiment 1 and embodiment 2 of the present invention.

During the test: In the initial state as shown in FIG. 5, the probe 33 doesn't contact the tested chip Pad, the elastic component 37 is in the initial compression state, and the supporting elastic layer 352 is in the uncompressed state; with the application of test OD as shown in FIG. 6, the probe contacts the tested chip Pad and displaces in the vertical direction, and most of the displacement is absorbed by the elastic component 37, and the rest is absorbed by the probe 33 and the concave supporting structure 35 together; due to the different thickness of the supporting elastic layer 352 on two sides of the probe 33, the probe 33 inclines slightly while moving vertically, resulting in the slippage with the distance of L, which can push away the dirt and oxide on the surface of the tested chip and achieve a more stable electrical connection.

Embodiment 2: Refer to FIG. 1-6

A membrane probe head consists of a support 31 providing an acting surface 311, membrane 32 covering the acting surface 311 of the support 31, a probe 33 and an interconnecting wire 34 arranged on the membrane 32. The specific structure is the same as that of the membrane probe head in embodiment 1, which will not be repeated here.

Embodiment 3: Refer to FIGS. 1, 2, 7 and 8

A membrane probe card consists of a PCB board 1, a connector 2 and a membrane probe head 3; the membrane probe head 3 consists of a support 31 providing an acting surface 311, membrane 32 covering the acting surface 311 of the support 31, a probe 33 and an interconnecting wire 34 arranged on the membrane 32.

Figure 7:
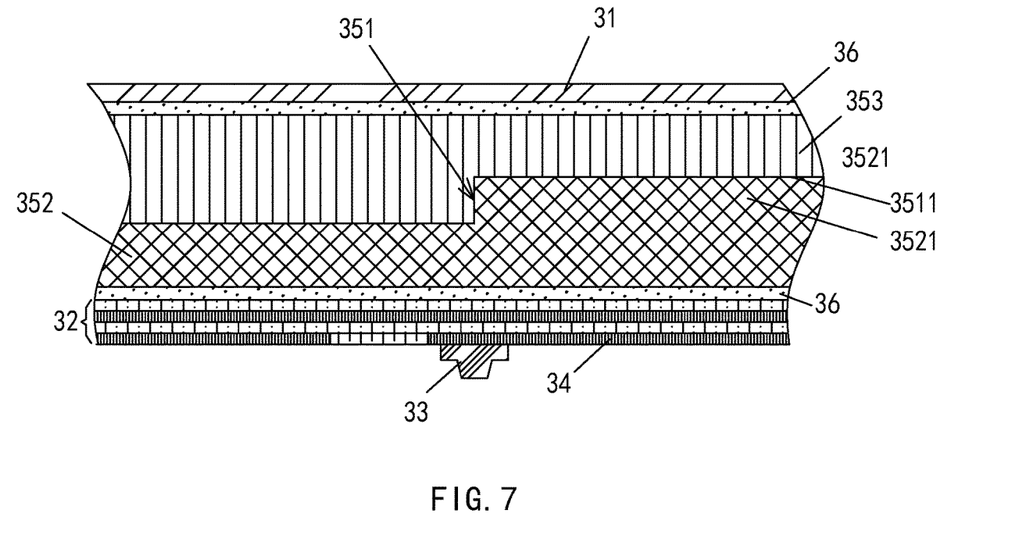
FIG. 7 is a view of the concave supporting structure of the membrane probe head according to embodiment 3 of the present invention.
Figure 8:
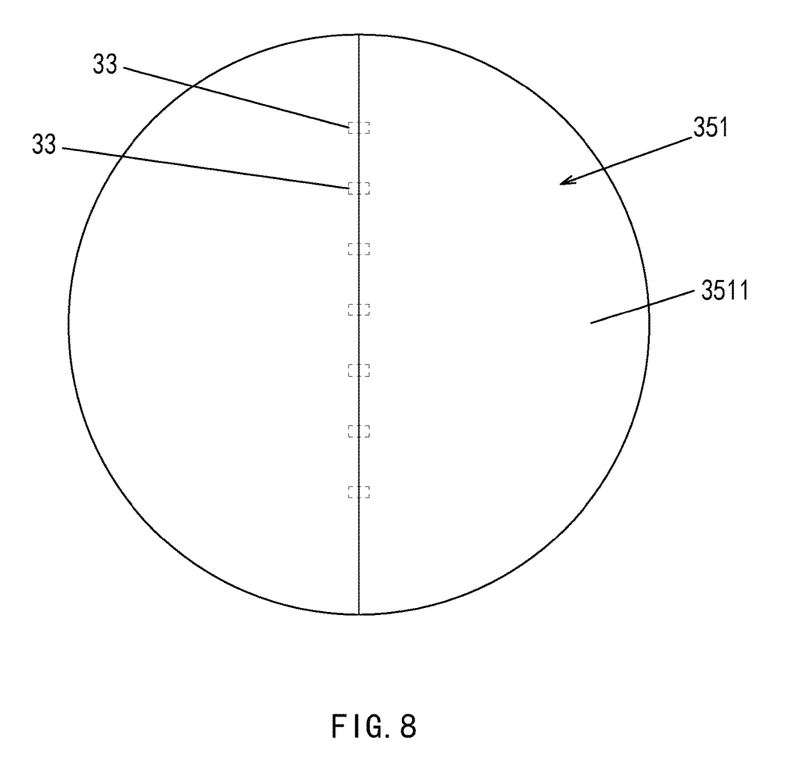
FIG. 8 is a view of the corresponding positions of each concave and the probe in the concave structure according to embodiment 3 of the present invention.

The difference from embodiment 1 is that the probes 33 are in a straight row, and the concave 3511 is not a groove, but a half of the supporting rigid body 353 is concave upward, that is, the supporting rigid body 353 is half thick and half thin, and the thin side forms the concave 3511, as shown in FIG. 7, while a row of probes 33 is correspondingly located across the walls of the concaves 3511, as shown in FIG. 8. The shape of the supporting elastic layer 352 matches with the lower surface of the supporting rigid body 353, which also generates the thickness difference of the part on two sides of the probe 33 on the supporting elastic layer 35 to achieve the effect of measuring slip for the probe 33 as in the embodiment.

The others are the same as those in the embodiment 1 and will not be repeated herein.

The above embodiments are used as examples, and the following practical changes can be made in practice:
1. The concave 3511 can be a groove according to embodiment 1 or a thinned part according to embodiment 3. The quantity and shape of the concaves 3511 can be adjusted according to the actual quantity and distribution of the probes 33;
2. The concaves need to correspond to the probes. Here, one concave can correspond to one probe, or one concave can correspond to several probes;
3. The supporting rigid body 353 can be removed and not used, but the concave structure 351 can be directly arranged on the acting surface 311 of the support 31;
4. The adhesive layer 36 between the membrane 32 and the supporting elastic layer 352 can also be removed. The membrane 32 can be fixed relative to the lower surface of the supporting elastic layer 352 in other ways, or not fixed but only tightened against the lower surface of the supporting elastic layer 352.

It should be noted that the above described embodiments are only for illustration of technical concept and characteristics of present invention with purpose of making those skilled in the art understand the present invention, and thus these embodiments shall not limit the protection range of present invention. The equivalent changes or modifications according to spiritual essence of present invention shall fall in the protection scope of present invention.

The invention claimed is:
1. A membrane probe card comprising:
   a PCB board,
   a connector, and
   a membrane probe head, the membrane probe head comprising a support including a convex structure projecting in a projecting direction from a base end to an end surface, the end surface being an acting surface, a membrane covering the acting surface of the support, one or more probes arranged on the membrane so as to project from the membrane in the projecting direction, and an interconnecting wire buried inside the membrane;

wherein:

a concave supporting structure is arranged between the acting surface of the support and the membrane;

the concave supporting structure comprises:

a concave structure comprising one or more concaves fixed relative to the acting surface, the one or more concaves extending concavely inward in a direction towards the base end of the support and being arranged at positions respectively corresponding to positions of the one or more probes along the acting surface such that each concave of the one or more concaves is eccentric with respect to a projection of a corresponding probe on the acting surface, and a supporting elastic layer embedded between the concave structure and the membrane;

the supporting elastic layer is provided with one or more convex inserts relative to the one or more concaves in the concave structure, and the one or more convex inserts of the supporting elastic layer project convexly towards the base end of the support and are respectively embedded in a corresponding concave of the one or more concaves; and a thickness of the supporting elastic layer varies along an extension direction of the supporting elastic layer such that a first thickness of the supporting elastic layer on one side of an axis of a probe of the one or more probes in the extension direction is less than a second thickness of the supporting elastic layer on an opposite side of the axis of the probe in the extension direction, the axis extending in the projecting direction and being transverse to the extension direction, and the first thickness and the second thickness being respective dimensions of the supporting elastic layer along a direction orthogonal to the extension direction.

2. The membrane probe card according to claim 1 wherein:

a concave of the one or more concaves is a column-shaped or frustum-shaped groove in a vertical section, and the axis of the probe extends across an outer contour line of a corresponding groove.

3. The membrane probe card according to claim 1 wherein:

a concave of the one or more concaves is hemisphere-shaped or spherical crown-shaped groove in a vertical section, and the axis of the probe overlaps a corresponding groove so that the axis is:

within an outer contour line of the corresponding groove along the extension direction, and offset from a center of the corresponding groove along the extension direction.

4. The membrane probe card according to claim 1 wherein:

the concave supporting structure also comprises a supporting rigid body which fixedly covers the acting surface of the support, and the concave structure is formed in the supporting rigid body.

5. The membrane probe card according to claim 1 wherein:

the convex structure of the support is arranged in a middle of the support along a length direction of the support transverse to the projecting direction;

the support further includes a connecting surface arranged on a periphery of the convex structure of the support to contact against the PCB board, the connecting surface also being covered by the membrane, and at least one probe of the one or more probes being also arranged at the membrane covering the connecting surface;

the concave supporting structure is also arranged between the connecting surface of the support and the membrane; and the supporting elastic layer in the concave supporting structure is embedded between the connecting surface and the membrane.

6. The membrane probe card according to claim 1, wherein the one or more concaves extend concavely inwards in a direction away from the one or more probes.

7. The membrane probe card according to claim 1, wherein a width of each of the one or more concaves along a direction transverse to the projecting direction is smaller than a width of the acting surface.

8. The membrane probe card according to claim 1, wherein:

the concave structure comprises a plurality of concaves fixed relative to the acting surface;

a plurality of probes are arranged on the membrane so as to project from the membrane in the projecting direction; and the plurality of concaves extend inward in the direction towards the base end of the support and are arranged at positions respectively corresponding to positions of the plurality of probes along the acting surface such that each concave of the plurality of concaves is eccentric with respect to a projection of a corresponding probe on the acting surface.

9. A membrane probe head comprising:

a support including a convex structure projecting in a projecting direction from a base end to an end surface, the end surface being an acting surface, a membrane covering the acting surface of the support, one or more probes projecting in the projecting direction from the membrane, and an interconnecting wire arranged on the membrane;

wherein:

a concave supporting structure is arranged between the acting surface of the support and the membrane;

the concave supporting structure comprises:

a concave structure comprising one or more concaves fixed relative to the acting surface, the one or more concaves extending concavely inward in a direction towards the base end of the support and being arranged at positions respectively corresponding to positions of the one or more probes along the acting surface such that each concave of the one or more concaves is eccentric with respect to a projection of a corresponding probe on the acting surface, and a supporting elastic layer embedded between the concave structure and the membrane;

the supporting elastic layer is provided with one or more convex inserts relative to the one or more concaves in the concave structure, and the one or more convex inserts of the supporting elastic layer project convexly towards the base end of the support and are respectively embedded in a corresponding concave of the one or more concaves; and a thickness of the supporting elastic layer varies along an extension direction of the supporting elastic layer such that a first thickness of the supporting elastic layer on one side of an axis of a probe of the one or more probes in the extension direction is less than a second thickness of the supporting elastic layer on an opposite side of the axis of the probe in the extension direction, the axis extending in the projecting direction and being transverse to the extension direction, and the first thickness and the second thickness being respective dimensions of the supporting elastic layer along a direction orthogonal to the extension direction.

10. The membrane probe head according to claim 9 wherein:
   a concave of the one or more concaves is a column-shaped or frustum-shaped groove in a vertical section, and
   the axis of the probe extends across an outer contour line of a corresponding groove.

11. The membrane probe head according to claim 9 wherein:
   a concave of the one or more concaves is a hemisphere-shaped or spherical crown-shaped groove in a vertical section, and
   the axis of the probe overlaps a corresponding groove so that the axis is:
      within an outer contour line of the corresponding groove along the extension direction, and
      offset from a center of the corresponding groove along the extension direction.

12. The membrane probe head according to claim 9 wherein:
   the concave supporting structure also comprises a supporting rigid body which fixedly covers the acting surface of the support, and
   the concave structure is formed in the supporting rigid body.

13. The membrane probe head according to claim 9 wherein:
   the convex structure of the support is arranged in a middle of the support along a length direction of the support transverse to the projecting direction;
   the support further includes a connecting surface arranged on a periphery of the convex structure of the support, the connecting surface also being covered by the membrane, and at least one probe of the one or more probes being also arranged at the membrane covering the connecting surface;
   the concave supporting structure is also arranged between the connecting surface of the support and the membrane; and
   the supporting elastic layer in the concave supporting structure is embedded between the connecting surface and the membrane.

14. The membrane probe head according to claim 9, wherein a width of each of the one or more concaves along a direction transverse to the projecting direction is smaller than a width of the acting surface.

15. The membrane probe head according to claim 9, wherein:
   the concave structure comprises a plurality of concaves fixed relative to the acting surface;
   a plurality of probes are arranged on the membrane so as to project from the membrane in the projecting direction; and
   the plurality of concaves extend inward in the direction towards the base end of the support and are arranged at positions respectively corresponding to positions of the plurality of probes along the acting surface such that each concave of the plurality of concaves is eccentric with respect to a projection of a corresponding probe on the acting surface.

16. The membrane probe head according to claim 9, wherein the one or more concaves extend concavely inwards in a direction away from the one or more probes.

\* \* \* \* \*